United States Patent [19]

Sheets

[11] 3,941,475

[45] Mar. 2, 1976

[54] OPTICAL MICROCIRCUIT PRINTING SYSTEM

[75] Inventor: Ronald E. Sheets, Westminster, Calif.

[73] Assignee: Tamarack Scientific Co., Inc., Orange, Calif.

[22] Filed: July 1, 1974

[21] Appl. No.: 484,564

[52] U.S. Cl. .................. 355/78; 355/71; 355/132; 240/41.3; 350/167
[51] Int. Cl.² ........................................ G03B 27/16
[58] Field of Search ............ 350/8, 17, 167; 355/67, 355/71, 78, 132; 352/198; 353/38, 97, 98; 240/41.3

[56] References Cited
UNITED STATES PATENTS

| | | | |
|---|---|---|---|
| 2,186,123 | 1/1940 | Rantsch et al. | 353/38 |
| 2,326,970 | 8/1943 | Rantsch | 353/38 |
| 2,803,163 | 8/1957 | Ulffers | 353/38 |
| 2,991,691 | 7/1961 | Schering | 352/198 |
| 3,296,923 | 1/1967 | Miles | 353/38 |
| 3,302,016 | 1/1967 | Larraburu | 240/41.3 |

*Primary Examiner*—David H. Rubin
*Attorney, Agent, or Firm*—Forrest J. Lilly

[57] ABSTRACT

A system is disclosed for exposing to ultraviolet light a semi-conductor or hybrid substrate coated with photoresist, in back of a mask having bars and very narrow slits, the diffraction patterns ordinarily experienced at the substrate being virtually eliminated through use, between the light source and the mask, of a light integrator comprised of two successive matrixes of very small lenses or lenticules. The lenticules form a large number of magnified, superimposed, slightly displaced images of the light source in the plane of the substrate; and when the slitted mask is interposed, this light forms a large number of diffraction patterns on the substrate which, because of their large number, superimposition, and slight displacement, results in extreme uniformity of light intensity and sharp resolution throughout the pattern of light on the substrate. A variable aperture is used in connection with the light integrator, and controls the half-angle of collimation by a collimator lens placed between the light integrator and the mask. Means are also provided for modifying the aperture pattern of this aperture plate changing it, for example, to one or more off-axis sub-apertures. a field lens is also used to improve superimposition of the lenticule images on the target.

9 Claims, 12 Drawing Figures

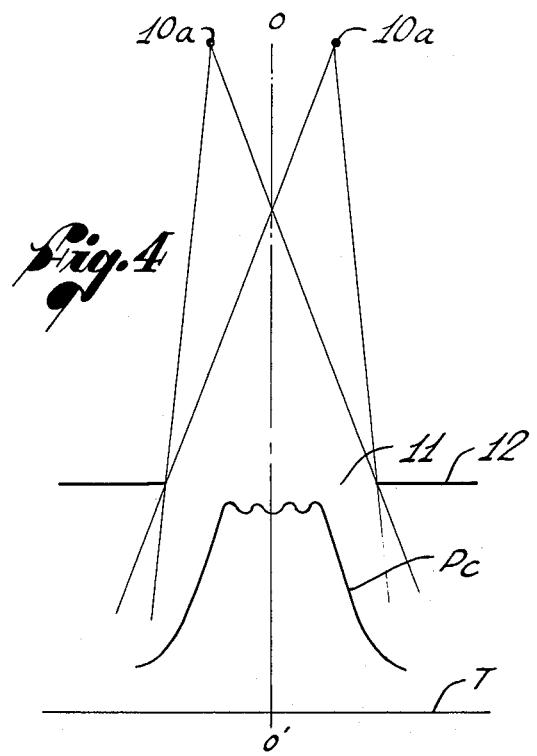
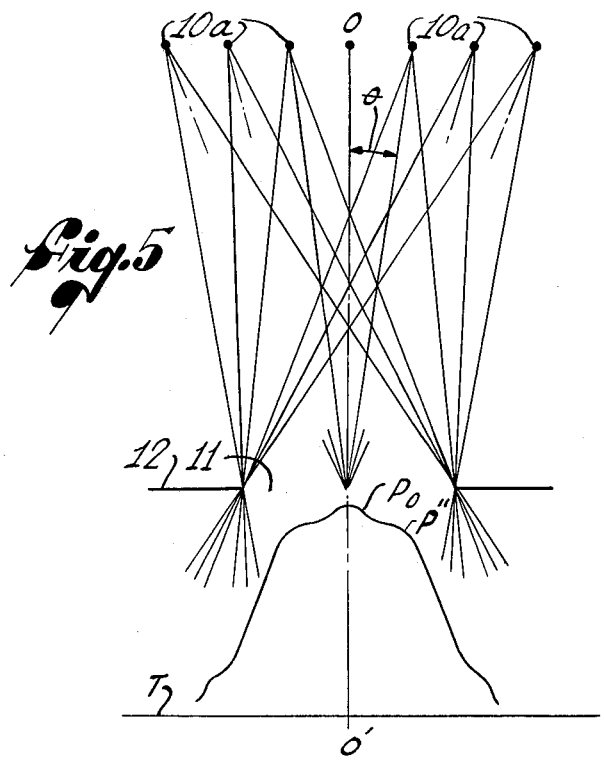
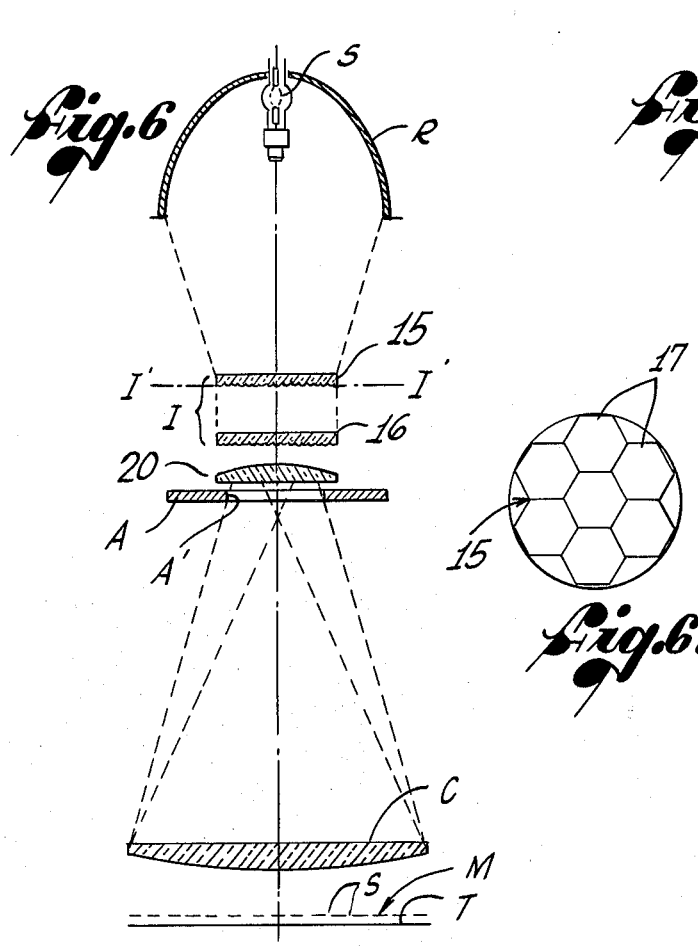
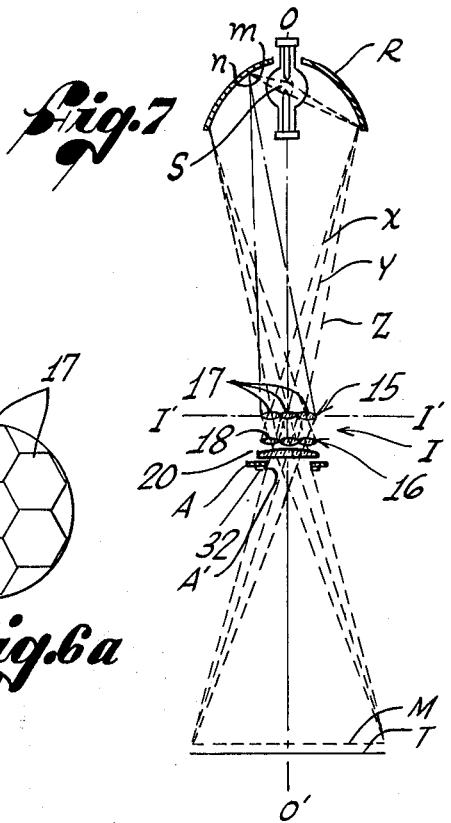

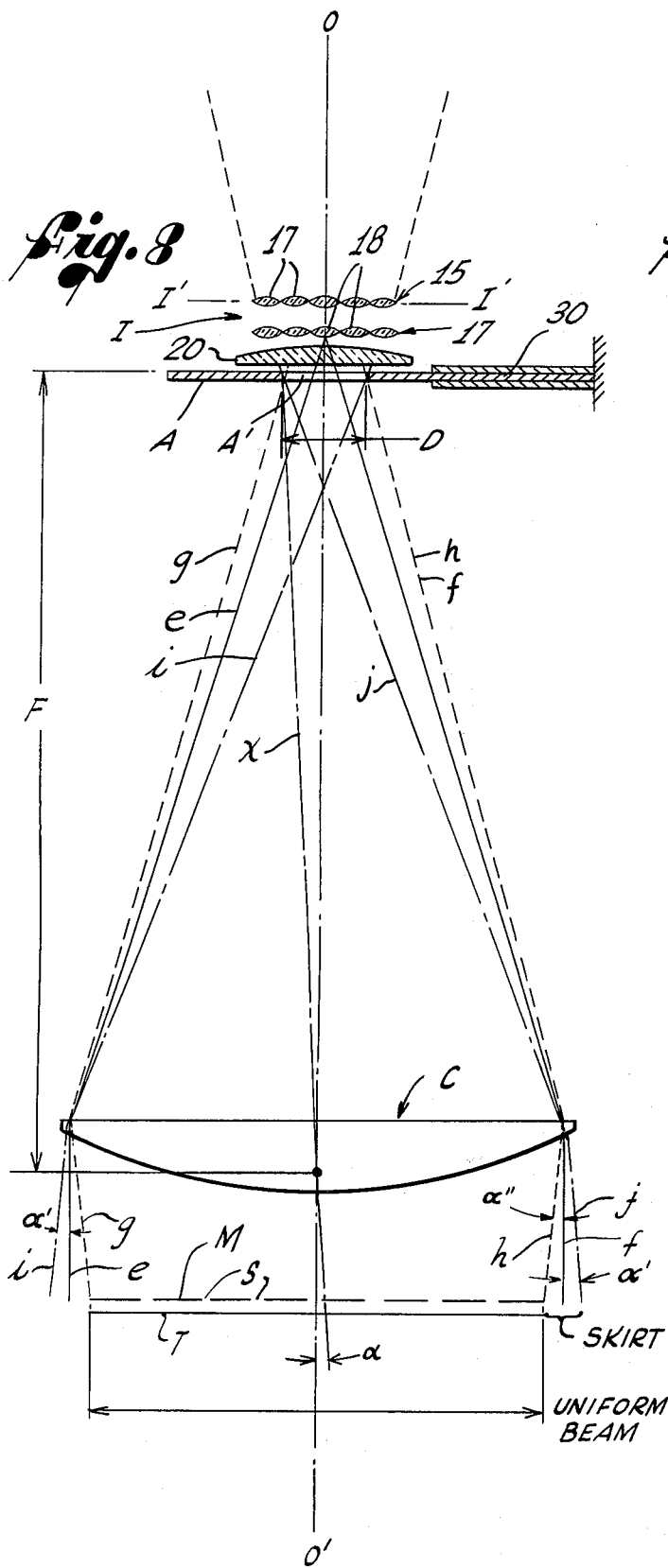
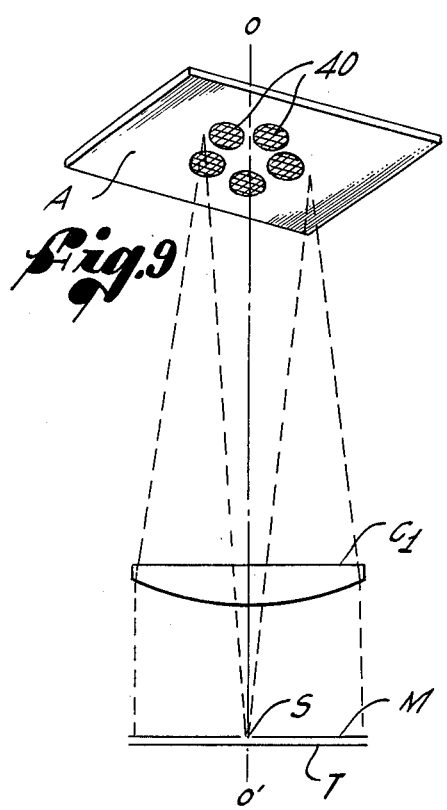
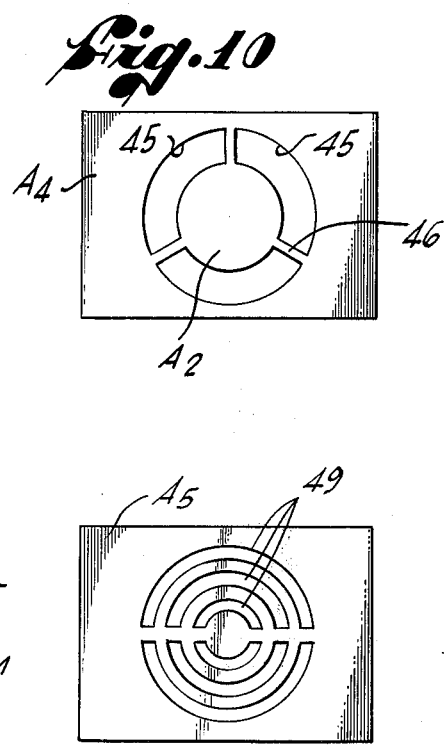

OPTICAL MICROCIRCUIT PRINTING SYSTEM

FIELD OF THE INVENTION

This invention relates generally to high resolution photo-resist exposure processes and systems for contact or off contact exposure of semi-conductor and hybrid photo-resist films to ultraviolet light in the 0.3 to 0.5 micron region of the spectrum, as practiced in the micro-electronic circuit fabrication industry where intimate contact between the slit mask and the photo-resist coated substrate may or may not exist.

BACKGROUND OF THE INVENTION

In the practice of this art, the placement of the mask directly against the substrate causes considerable wear on the mask, and accordingly, a small separation distance has been tried. However, the light passing through the very narrow slits in the mask, as used in the best practice heretofore known, is still subject to an unfortunate degree of Fresnel diffraction, resulting in non-uniform printing of fine line geometries used in microcircuits. This effect is a disturbing problem even at separation distances of only 0.0002 to 0.0010 in.

It is accordingly the major purpose of the invention to virtually eliminate or annul Fresnel diffraction patterns in microcircuit printing.

BRIEF SUMMARY OF THE INVENTION

The invention is incorporated in a known basic system which may be described as follows: A compact, high intensity arc, giving ultraviolet light in the 0.3 to 0.5 micron region of the spectrum, is used as an initial light source, and a collector is used with this source, either a condenser lens or a reflector, but preferably an elliptical reflector for its better light collecting capacity. A previously known light integrator of a special type, sometimes called a "fly's eye," or a lenticular, integrator, receives light from the collector. This integrator is composed of first and second spaced parallel plates, each comprising a lens matrix embodying a substantial multiplicity of small, close-spaced lenses or lenticules. A collimating lens receives light from this integrator and directs it, after collimation, through fine geometry slits in a mask onto the resist-coated substrate in the target plane, the substrate being positioned substantially at or very closely adjacent to the mask. The lenses in each matrix, in a present embodiment of the invention, are of the order of 0.1 inch across, and may be round, square or hexagonal.

The collector images the arc in the plane of the first lens matrix, filling each lenticule with light. The individual lenticules of the second matrix image each light-filled lenticule of the first matrix over the entire target area on the substrate, and thus images of all lenticules of the first matrix are superimposed on the target area, yielding fairly high uniformity of irradiation thereof. The size of the superimposed images on the target is determined by the size of each lenticule in the first lens matrix multiplied by the magnification factor of the lenticules in the second matrix.

Adjacent and relatively close to the integrator, either ahead of or behind it, is an aperture plate, and in the basic form of the invention, this plate has an aperture which may be just at the perimeter of the lens matrix, or it may be somewhat inside it. This aperture will later be seen to function as a secondary light source, associated with the light integrator, and viewed as a source by the collimator. According to the present invention, there are steps and means by which the size or area of this aperture, or its configuration and location relative to the optic axis, may be selectively varied so as, for example, to selectively regulate the area and/or position of the secondary light source. This can be done by means of a variable aperture iris or by a simple arrangement for interchangeability of aperture plates. The control and refinement made possible by this set of features will be described hereinafter.

Beyond the aperture plate, and shortly ahead of the mask, is the collimator lens for collimating the radiation from the light integrator to be near to parallel with the optic axis, which is perpendicular to the mask and substrate. For reasons described later, an adjustable collimation half-angle range of 1° to 4°, changeable by half-degree steps, has been found to enable optimized resolution in photo printing. It does this by permitting close correlation with other significant factors such as separation distance between mask and substrate, and the scale or fineness of slit geometry. This is an important achievement of the invention, and is thus accomplished by regulation, selection or adjustment of the secondary light source area and its positioning in the aperture plate, which in turn regulates the collimation half-angle, and enables optimized diffraction control within the 1° – 4° range.

As mentioned earlier, the light passing through a narrow slit is subject to the phenomena of diffraction, meaning, generally stated, creation of the familiar diffraction patterns, and characterized by deflection of the radiation partially into the "shadow" area behind the side edges of the slit. If there are a number of individual light sources, such as the light filled lenticules of the first matrix, a beam from each of these, after collimation, spreads across the widths of the narrow slits in the mask (e.g., of a typical width of 0.0002 inch, and at a typical collimation half angle of 2°). The rays emerging from the slits will contain diffraction patterns, one owing to each such source, of which there may be more than 100. There will thus be one diffraction pattern behind each slit for each light source, i.e., for each of the 100+ lenticules in the first matrix. Since the beams from the total number of lenticule sources in the first matrix must arrive at different angles relative to the optic axis, each unique, the diffraction patterns as they fall on the target area under the slit mask will be superimposed, but with minute lateral displacements from each to the next. The summation of light intensities from the multiple sources from point to point in the image plane on the substrate results in high uniformity of radiation intensity if no mask is in position, and, when a mask with a pattern of slits is in position, high uniformity and sharp demarcation of the elements of the geometric slit pattern as imaged on the substrate.

The system thus does not eliminate Fresnel diffraction, but superimposes a large number of diffraction patterns, with minute displacements between them, such that they overlap and integrate into uniformity. To recapitulate, the system utilizes a large multiplicity of source images closely spaced throughout an object plane, each of which, then functioning as a source object, being in turn imaged at the target plane at a magnification large enough to fill the target area. If the mask were removed, the radiation intensity over the target plane would be highly uniform from the superimposition of images of the lenticules of the first matrix. With the mask, the light from each such lenticule is subject to Fresnel diffraction in passing through the narrow slits in the mask, but the diffraction patterns under each slit, from the multiplicity of first matrix lenticule sources, merge over and into one another in a highly uniform blend. The superimposition of these minutely displaced diffraction patterns thus provides a high resultant uniformity of irradiation intensity throughout the slit geometry imaged on the photoresist substrate coating.

Having available at the target plane this highly uniform blend of diffraction light for any narrow slit or bar geometry desired, certain selected areas of the beam just beyond, or at, the aperture, can be masked out, without interfering materially with the uniformity of irradiation intensity at the target plane. In fact, as taught by the present invention, the multiple integrations and superimpositions of the light make it possible to block out some of the numerous lenses in the second matrix without losing significant uniformity. This makes it possible, within the scope of the invention, to significantly alter the appearance as seen from behind the mask, of the pattern of multiple lenticular sources exposed through the aperture plate. For example, by masking out a central area of the secondary light source aperture, a range of the rays which would be most perfectly collimated, say those of less than 1° half-angle, are eliminated, and the remaining rays are proportionately increased. There then results a proportionate increase in the more angular rays, which modifies diffraction in a manner found to improve final uniformity of diffraction light intensity at the target area. This follows from the fact that superimposition of the diffraction patterns on the target area from the multiple sources results, upon summation, of an intensity profile across the target area characterized by some peaking in the center. But by taking out a "core" of the highly collimated center rays, the intensity profile can be flattened, and even more perfectly uniform intensity achieved.

The fact that the aperture area significantly controls the angle of collimation has been mentioned hereinabove. Taking $\alpha$ as the half-angle of collimation, we have $$\text{Tan } \alpha = \frac{D/2}{F},$$

where D is the diameter of the aperture in the aperture plate, and F is the focal length of the collimator lens. From this relation, it can be seen that the collimation half-angle is proportional to the diameter of the aperture in the aperture plate. The present invention accordingly has as one of its important features, as mentioned above, a step-by-step control over the aperture diameter, and therefore over the half-angle of decollimation. The usefulness of this control will be stressed hereinafter.

A further feature of the invention is a field lens placed just beyond the second matrix of the optical integrator, in a position to assure good superimposition at the target plane of first matrix lenticule images at different distances from the optic axis.

These and further features and characteristics of the invention will be set forth in the ensuing detailed description of present illustrative embodiments thereof.

DESCRIPTION OF THE DRAWINGS

FIGS. 2, 3 and 4 show the passage of light from a point source or sources through a narrow slit in a mask onto a substrate, and show related light intensity profiles on the substrate, FIG. 2 showing a single point source and its profile, FIG. 3 two spaced point sources, and one profile corresponding to each, and FIG. 4 the same as FIG. 3 but with the profiles made by the individual sources added together to show the resultant;

FIG. 5 is similar to FIG. 4 but with a considerable increase in the number of light sources;

FIG. 6 shows a complete system in accordance with the invention;

FIG. 6a is a front elevation of a lenticular matrix of seven hexagonal lenticules;

FIG. 7 is a diagrammatic view similar to FIG. 6, but with certain rays traced through the system, but with the collimator omitted;

FIG. 8 shows the system of FIG. 6 from the light integrator down, but to larger scale and with rays traced through this lower portion of the system;

FIG. 9 shows the system with an aperture plate pattern comprised of multiple holes, spaced radially outward from the optic axis, and with a mask having a single pinhole aperture; and FIGS. 10 and 11 show alternative aperture plate patterns.

DESCRIPTION OF ILLUSTRATIVE EMBODIMENTS OF THE INVENTION

Figure 1:
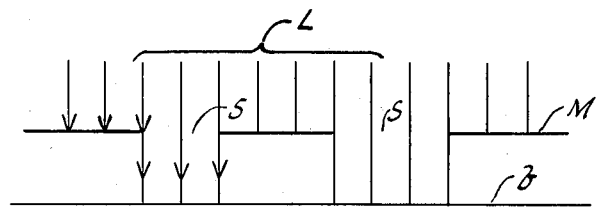
FIG. 1 is a diagram showing schematically the idealized passage of collimated parallel light through narrow slits in a mask onto a photo-resist coated substrate.

In FIG. 1, showing diagrammatically the prior art, collimated light L passes through slits $s$ in a mask M without diffraction, as represented, to expose a layer of photo-resist on a substrate $b$. The separation distance is generally very small, e.g. 0.0005 inch – 0.00075 inch. With such a system, in actuality, the light rays passing through the narrow slits are diffracted, and instead of sharp resolution at the edges of the light pattern cast on the photo-resist, diffraction patterns appear. The highly desired sharp demarcation lines between light and dark areas on the substrate thus are not forthcoming, and the process suffers accordingly.

Figure 2:
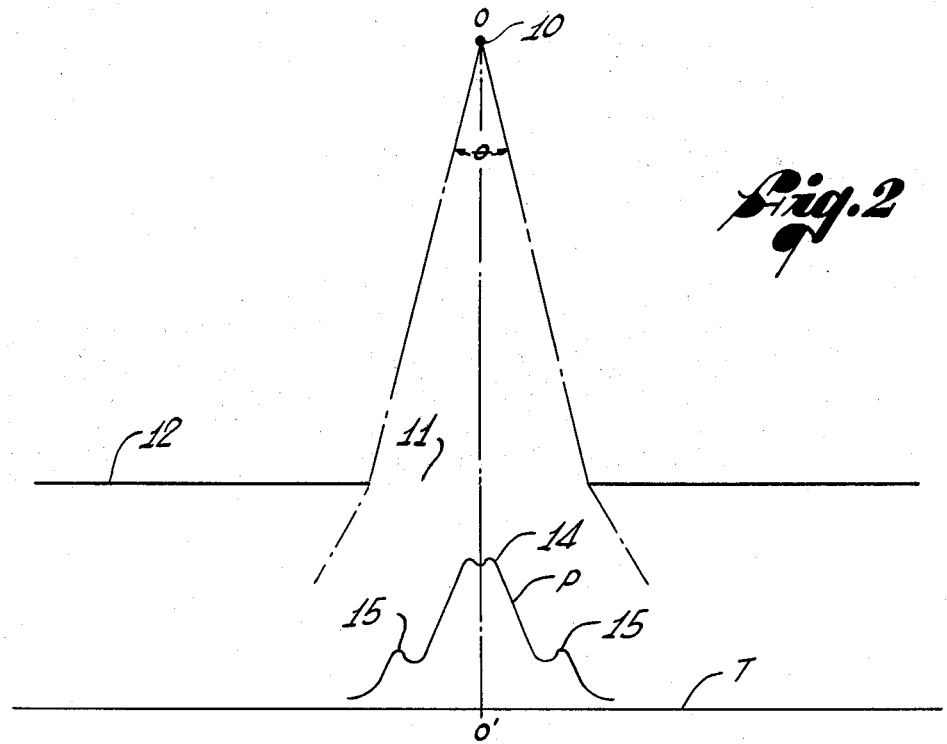

FIG. 2 shows a single light source 10 with a highly collimated beam at a small angle $\theta$ (much exaggerated in the Figures), passing through a slit 11 in a mask 12 onto a target T (e.g., a substrate consisting of a semiconductor coated with photoengraver's resist) spaced behind the mask at a predetermined separation distance of typically 0.0005 inch (also much exaggerated in the Figures), and shows a typical light intensity profile P on the target area resulting from diffraction by the slit. The pattern shown, which is characteristic of a very narrow slit, has a double-peak 14 in the center, leading to lobes or shoulders 15. The bounding rays from the source 10 are seen to be deflected outward, into the shadow, at the edges of the slit.

Figure 3:
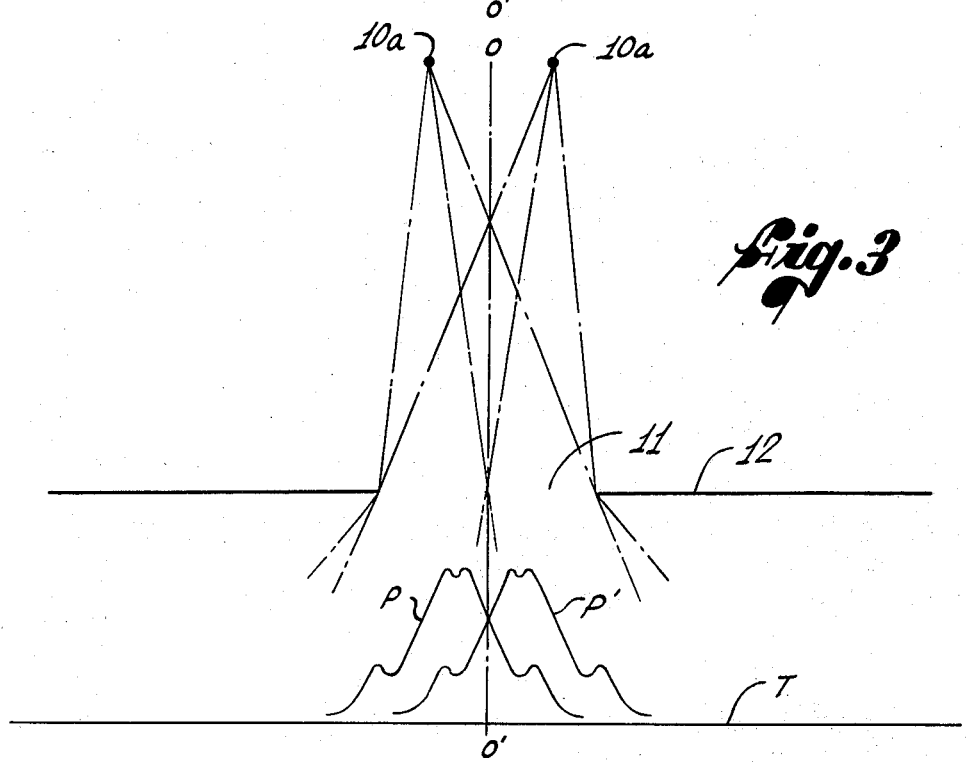

Assume now two such sources 10a (FIG. 3), each with an angle $\theta$ on opposite sides of the optic axis 0-0'. Two doublepeak diffraction patterns with intensity profiles P and P' are now formed, but are laterally displaced oppositely relative to the axis 0-0''. The combined or resultant profile is the summation of profiles P and P', and is seen at $P_c$ in FIG. 4. It will be observed that the resultant profile $P_c$ (FIG. 4) is wider, taller and flatter, and more uniform across the top. Assume further now that a large number of sources such as 10a, say more than 100, are added in the plane perpendicular to the optic axis and containing the sources 10a, being confined within an area whose center is on the optic axis (FIG. 5). Radiation from each of these will pass through the slit 11, and after diffraction by the latter, will have a diffraction pattern on the target, and an intensity profile P'' generally resembling those mentioned hereinabove. But, since radiation approaches from many different angles, these diffraction patterns, like those of FIG. 4, will be superimposed, but laterally displaced very slightly from one another. The result is that, owing to the very large number of superimpositions, and the very slight displacements of the patterns, the patterns overlap and merge into one another sufficiently to yield a nearly uniform irradiation intensity profile P'' across the target. There will generally, however, be some peak or hump left in the center, as represented at $P_o$. The sharp edges of the actual slit in the mask will then be fairly sharply defined on the target.

Before passing on, it should be mentioned that FIGS. 1–5 are much exaggerated to illustrate the principles involved. When the angles $\theta$ are reduced to a realistically small magnitude, and the separation distance between mask and substrate is reduced to say 0.0005 inch, the margins of the numerous superimposed slit patterns are sharp and very well resolved.

With reference primarily now to FIG. 6, which is a general view of the complete system, but also to FIGS. 7 and 8, the light source is the mercury arc S of an arc lamp, at one conjugate focus of an ellipsoidal reflector R, which images the arc S at its other conjugate focus, on the first of two lenticular matrixes 15 and 16 of a light integrator I, with a magnification ratio as represented by the rays $m$ and $n$, and $x$, $y$ and $z$. Beyond the matrix elements 15 and 16 a short distance is, preferably, a field lens 20, and immediately beyond that an aperture plate A. The aperture plate A may equivalently be located just ahead of the light integrator I. A collimator lens C is situated so as to collimate the divergent light coming through the aperture plate; and beyond that is a mask M with narrow light slits $s$ at very close spacing, e.g., 0.0005 inch – 0.00075 inch. The light passing through the slits is diffracted, and thence falls on target T, comprised of a substrate coated with photoengraver's "resist." The illuminated lenticules 17 of the first matrix 15 are imaged on the target T, in back of the slitted mask M, by the lenticules 18 of the second matrix 16 of the integrator I. In particular, the individual images of the illuminated lenticules of the first matrix formed by the corresponding lenticules of the second matrix are magnified and superimposed over the entirety of the mask and target area.

The system will now be examined in more detail, reference being had more particularly to FIGS. 7 and 8. It will be noted that the collimator C is omitted in FIG. 7 for simplicity of illustration, but it would be used in practice in the situation shown in FIGS. 6 and 8. Also, only seven lenticules are indicated in the lens matrixes in FIGS. 6a and 7, again for simplicity of illustration.

A compact, but finite, intense light source in the form of a mercury arc S is situated at a focal point of the collector R, preferably and here shown as an elliptic reflector, the arc being located a short distance beyond the principal focus of the collector. The convergent beam from the collector forms an image of the arc S in the plane I' – I' of the first lenticular matrix 15 of the light integrator I, the image being magnified to cover the effective area of the matrix. This matrix 15 is made up of an assembly of small coplanar lenticules 17, here shown as hexagonal (see FIG. 6a), though they may be round or square. In a present actual embodiment, the hexagonal lenticules are of a dimension, between opposite parallel edges, of 0.1 inch, and are 273 in number. They are in an assembly characterized by a pattern of one center lenticule, surrounded by successive rings of lenticules in borderline contact or near contact. The present simple representative case of FIG. 7 has one center lenticule 17, surrounded by a ring of six of the lenticules 17. It will be clear that successive rings may be added in predetermined numbers of lenticules according to the sequence 19, 37, etc. The numbers useable can extend to well above 100 in practice as already mentioned. The arc reflector and conjugate foci are so arranged that an image of the arc covers the entire first lens matrix 15. Rays from different points along the arc source, incident at common points of the reflector, are reflected at different angles such as to reach different points of the area of the lens matrix 15. The system is so designed that of such rays, the rays $m$ and $n$ from opposite ends of the arc S are reflected at such angles as to be incident on the matrix 15 at opposite edges thereof. Rays from other points on the arc are reflected at angles such as to cover the entire area of the lens matrix 15. Thus the rays $x$, $y$ and $z$, from one edge of the reflector are directed along three separate angularly related paths to pass through the optical centers of the three representative lenticules of matrix 15, will be understood to originate at three separate points along the arc, as diagrammed in FIG. 7. This light from the reflector fills the lenticules 17 of the matrix 15 with light.

Beyond first lens matrix 15 is situated a second but identical lens matrix 16, with a number of individual lenticules as in the first matrix 15. Individual lenticules 17 of the first matrix are imaged by corresponding lenticules 18 of the second matrix on the target T (FIG. 7), each such image covering the entire target area, excepting where masked out. Thus, there are as many superimposed images on the target as there are lenticules in each matrix. To bring the rays close to perpendicular relative to the target, a convergent plano-convex collimating lens C (FIGS. 6 and 8) is situated just ahead of the slitted mask M, beyond which, at a spacing of less than a thousandth of an inch, is the target T. This target T comprises a suitable substrate, coated with a layer of photo-resist, as known in the art.

Preferably, as an added or optional feature in the accomplishment of uniformity of light radiation on the target area, I use, just beyond the second lens matrix, a convergent field lens 20, which acts to tip the rays from matrix 15 toward the optic axis. The rays from lenticules near the periphery of the matrix are tipped more than those near the center, so as to accomplish good superimposition at the target plane of first matrix lenticule images whose object lenticules are at different distances from the optic axis.

A primary feature of the invention is the aforementioned aperture plate A, with an aperture A' located either just beyond, or just ahead of, the light integrator. It coacts in either case with the light integrator to act as a second light source, which is viewed by the collimator, and which establishes the diameter and angle of the cone of light going to the collimator.

Thus, to review, and neglecting the mask for the moment, there are superimposed on the target area a large multiplicity of images of the light-filled first matrix lenticules 17, depending upon the number of light channels from the lenticules in the first matrix through the lenticules in the second matrix to the target plane. The superimpositions thus possible are large in number, and the effect is to distribute any non-uniformity in the light source area to so many locations on the target as to achieve a great boost in uniformity over the target area.

FIGS. 6–8 show diagrammatically the aperture plate A, which has, in this case, a circular aperture $A_1$, of a diameter equal to, or preferably encroaching slightly on, the full diameter of the light from the light integrator. The aperture $A_1$ is variable in diameter, preferably in seven discrete half-degree steps, and in the case of FIG. 8, to change aperture sizes, the aperture plate A is shown as slidable in a diagrammatically designated way 30, and is interchangeable with aperture plates A having circular apertures of different diameters or, as will be further described presently, with apertures of other shapes, configurations and numbers, sometimes off to one side of the optic axis. A variable area aperture $A_1$ can also be provided in the form of a conventional iris represented at 32 in FIG. 7, or in the form of a multi-aperture wheel, not shown. The invention requires, in all cases, for complete usefulness, means for changing or modifying the aperture in the aperture plate, in some cases, for modifyings its size, or its position relative to the optic axis, and in some, for changing to discontinuous aperture patterns, i.e., a pattern of slots or holes in an opaque plate or mask, as will be disclosed more fully hereinafter.

Adverting to specifics, change in circular aperture diameter effects an important change in the angle of collimation of the beam by the collimating lens C, which is useful for an important purpose to be described. Referring again to FIG. 8, the collimation half-angle $\alpha$ is determined by the diameter D of the aperture $A_1$ of the hole in the aperture plate according to the simple trigonometric relation $$\text{Tan } \alpha = \frac{D/2}{F},$$

where F is the focal length of the collimator lens and the principal focus of the collimator lens is at the aperture A'. Divergent rays $e$ and $f$ from centrally located lenticules of the second matrix going to the edges of the collimator lens are refracted as shown, emerging as perfectly collimated (0°) parallel rays $e$ and $f$. Some rays, as traced in FIG. 8, however, will emerge divergently, as at angle $\alpha'$, and some convergently, as at $\alpha''$ relative to the parallel rays. The angles $\alpha'$ and $\alpha''$ may be referred to as the half angles of collimation (divergent and convergent). It will be seen, however, that these angles $\alpha'$ and $\alpha''$ differ slightly from the half angle of collimation $\alpha$ between axis 0-0' and limiting ray X from the edge of the aperture A' to the node of the lens. The maximum angle by which rays diverge from the parallel is commonly referred to as the collimation half-angle. Divergent outside rays such as $g$ and $h$ going to outer edge portions of the collimator lens C, emerge convergently, at which may thus be termed the collimation half-angle $\alpha''$ (FIG. 8). Other rays such as $i$ and $j$ emerge at the equal half-angle $\alpha'$ of maximum divergence, inside the parallel collimated rays $e$ and $f$. The convergent beam inside the limiting convergent rays $g$ and $h$ is a uniform beam, and the rays outside thereof, known as the skirt, are not used in printing through the slits in the mask M onto the substrate. This is simply accomplished by dimensioning the system so that the mask and substrate are inside the confines of the uniform convergent beam defined by the rays $g$ and $h$. It will be clear, from a study of FIG. 8 and from the relation $$\text{Tan } \alpha = \frac{D/2}{F},$$

that the half-angle of collimation $\alpha$ which is the angle between the optic axis and a ray $x$ from an edge of the aperture A' through the nodal point of the lens G, depends directly upon the diameter D of the aperture $A_1$ in the aperture plate. I have discovered that decollimation half-angles in a sequence of 1°, 1½°, 2°, 2½°, 3°, 3½° and 4° enable optimum resolution of diffraction patterns of fine geometry lines, and adjustable or interchangeable apertures to enable that particular series of steps are preferred.

A change in the collimation angle, by change in the diameter of the aperture A', produces alterations in the diffraction pattern changing the range of angles of the rays emerging from the collimator lens (reducing diffraction with increase in the collimation angle). The uniformity and resolution of the slit image on the target plane is thus subject to a fine degree of regulation. The manufacturer can optimize these conditions for any particular mask he may have in hand, for the fineness of the slits, or to suit his own processing techniques, or for other purposes, by adjustment within the range of 1° to 4°, as aforesaid. Thus, to recapitulate, a change in the collimation angle, accomplished by changing the diameter of the aperture A, provides a means for altering the resultant diffraction effects which occur in off contact and contact printing. This capability for altering the diffraction effects can be utilized to optimize the resolving capability of each particular mask. Masks used in semi-conductor manufacture, for example, utilize a very wide variety of geometries and sizes.

It was mentioned in connection with FIGS. 2 to 5 that increase in the number of light sources supplying light at different angles to a narrow light slit in a diaphragm or mask increases the number of Fresnel diffraction patterns beyond, and that these patterns from different sources are similar, but laterally spaced from one another. Further, it was pointed out that as the number of patterns is increased, their characteristic laterally displaced profiles yield, when summed, progressively flattened resultant intensity peaks, tending always, with increase in the number of sources, toward improved uniformity of intensity along the profile across the target plane. With all the lenticules of the second matrix cooperating in the superimpositioning of a like number of slightly displaced diffraction patterns of the target area, and with the number of patterns up to 100 or more, e.g., to 273, as can be practically accomplished, the peak value irradiation intensities are very well averaged out by the integration process described, and high uniformity of irradiation intensity capable of good resolution of relatively fine mask slits or holes, is achieved over the target area.

As foreshadowed by the discussion of FIGS. 2–5, however, the intensity profile resulting from integration of a large number of the diffraction patterns still may have some peaking in the center, as represented at $P_o$ in FIG. 5. This is managed by the invention as now to be described.

Having achieved a high degree of uniformity of irradiation of the target area and even though some "peaking" remain, as just mentioned, further improvements are available, including a compensation for such peaking. Because of the very uniform level of radiation uniformity on the target plane, a particular area of the secondary light source established by original circular aperture A' in the aperture plate A can be masked or blocked out, and while a proportionate degree of all-over irradiation intensity is thereby lost, there is no essential degradation of uniformity. Now, it is a fact that the strongly parallel rays of the collimated beam, along the central axis, i.e., those that make up the "core" of the beam, are highly collimated, and "most" parallel, containing substantial light at and very near 0° collimation.

Thus, I may in some cases mask out all or a large proportion of central or axial "core" of the printing beam by use, in the modified aperture plate $A_4$ of FIG. 10, of a central solid disc $A_2$ in the center of the main aperture 45, the disk $A_2$ being mounted by radial struts 46. The rays from each lenticule outside the disk $A_2$ travel angularly through the system, rather than parallel with the optic axis, and with the slitted mask removed, would uniformly irradiate the substrate or target B. In this case, therefore, there is available, at the mask, uniform light from all lenticules outside the disk $A_2$, all at predetermined collimation angles beyond the collimating lens, and none of which will be normal to the target area.

Assume now that the slit mask is installed, and the uniform light from the collimator lens is diffracted at the light slits. The light from all of the active sources will produce superimposed but slightly displaced diffraction patterns, as before; but owing to the removal of central parallel rays along the optic axis, irradiation intensity in the central portion of the target area by rays perpendicular thereto is reduced. This results, among other things, in compensating for the peak or hump $P_o$ in the intensity profile of the integrated diffraction pattern, as shown in FIG. 5, and described earlier. Thus, there is achieved even further improvement in the uniformity of the geometric slit pattern falling on the photosensitized substrate in the target area.

For another illustration, refer next to FIG. 9, showing aperture plate A containing five round apertures 40 symmetrically distributed about optic axis 0-0', and all uniformly spaced from said axis, as illustrated. A number of lenticules of the second matrix 16 are visible through each of the apertures 40. The usual collimator is shown at $C_1$ with its collimated beam falling on a slitted mask M. Behind the mask, at close spacing, is the target or substrate T. From what has gone before, it will be appreciated that the lenticules visible through each hole 40 will, or would, each cover the entirety of the target area if the mask were removed, and thus, from principles described earlier, uniform images of the source would be superimposed over the entire target area if the mask were removed. And because of the diffraction phenomena described above, diffraction patterns produced by any narrow openings in the mask will be slightly displaced from one another on the exposed portion of the target area (owing to multiple sources at different angles), and the multiple diffraction patterns will merge into uniformity of irradiation intensity.

Rays from the second matrix lenticules exposed by the off-axis apertures 40 will evidently, in this case, all be at a substantial angle to the optic axis, and therefore non-perpendicular to the target area. This makes it possible, without degrading uniformity at the target area, to decrease the diffraction effect at fine geometry holes, slits or bars by superimposing the Fresnel diffracting patterns produced by the apertures 40 in the aperture plate.

It will be seen that a modification such as represented by FIG. 9 significantly alters the appearance of the light source as viewed from the mask or substrate being exposed.

The ability to use multiple holes, rings or slots, as suggested in FIG. 9, without changing the uniformity of irradiation at the target plane, and with radiation confined to angular directions, thus makes it possible to decrease the diffraction effect of small scale slits and bars in the mask by superimposing the Fresnel diffraction patterns produced by each off-axis aperture 40 in the aperture plate A (FIG. 9).

FIGS. 10 and 11 show alternate aperture plates $A_4$ and $A_5$. The former has, concentric with its round aperture $A_4$, but annularly spaced inside thereof, a disk 45, held in position by strips 46, so as to form slots 47. The latter has a series of alternating rings 48 and annular slots 49.

It will be understood that the invention may be practiced in various additional physical forms, those here shown being illustrative only. The scope of the invention is stated in the appended claims.

I claim:

1. In an illumination system for exposing a photosensitive target surface to ultraviolet light,
   a primary light source in the form of an arc,
   means for collecting light from said source and directing it to a focus in a focal plane,
   a fly's eye light integrator with a first lenticular matrix in said focal plane, and a second lenticular matrix just beyond said focal plane, the lenticules of said second matrix being arranged to form magnified, superimposed images of illuminated lenticules of the first matrix on said target surface,
   a collimator lens for receiving the image forming rays from said second matrix and collimating them into light striking the target surface symmetrically about a center optic axis perpendicular thereto,
   aperture plate means located in proximity to the light integrator having an aperture therein which acts as a secondary source of the light emerging from the light integrator, and which controls the half angle of collimation of the beam of light emitted by the collimator lens,
   means for regulating said aperture to adjust the half angle of collimation of said beam, and
   a diffraction slit mask immediately in front of said target surface.

2. The subject matter of claim 1, wherein said aperture area regulation means includes means for selectively changing aperture plates of differing aperture characteristics.

3. The subject matter of claim 1, wherein said aperture area regulation means comprises an iris.

4. In an illumination system for exposing a photosensitive target surface to ultraviolet light,
a primary light source in the form of an arc,
means for collecting light from said source and directing it to a focus in a focal plane,
a fly's eye light integrator with a first lenticular matrix in said focal plane, and a second lenticular matrix just beyond said focal plane, the lenticules of said second matrix being arranged to form magnified, superimposed images of illuminated lenticules of the first matrix on said target surface,
a collimator lens for receiving the image forming rays from said second matrix and collimating them into light striking the target surface symmetrically about a center optic axis perpendicular thereto,
aperture plate means located in proximity to the light integrator having an aperture therein which acts as a secondary light source for image forming light emerging from the light integrator and which has a predetermined dimension controlling the collimation of the beam of light emitted by the collimator lens,
an apertured mask immediately in front of said target surface, and
a convergent field lens immediately downstream of said light integrator adapted to superimpose images in the target plane of lenticules of the first lens matrix at different radii from the optic axis of the system.

5. The subject matter of claim 1, wherein said aperture plate means contains a plurality of spaced apertures, located radially outward of the center of the aperture plate.

6. The subject matter of claim 1, wherein said aperture comprises at least one circular aperture concentric with the center of the aperture plate, and spaced radially outward from said center.

7. The subject matter of claim 1, wherein the means for regulating the aperture has a regulation range of collimation half angle adjustment between the approximate limits of 1° and 4°.

8. The subject matter of claim 1, wherein the aperture area in said aperture plate means is effectively offset radially outward from said center optic axis, and a portion of said plate occupies a centralized position relative to said optic axis, in such a manner as to mask out at least a substantial proportion of the most collimated rays of light lying in the region of said optic axis.

9. The subject matter of claim 1, wherein the aperturing in said aperture plate is substantially offset from said optic axis.

* * * * *